United States Patent [19]

Lotter

[11] Patent Number: 4,509,812
[45] Date of Patent: Apr. 9, 1985

[54] PLUG CONNECTOR FOR DIL COMPONENTS

[76] Inventor: Karl Lotter, Falkenstr. 2, D-8959 Buching, Fed. Rep. of Germany

[21] Appl. No.: 472,844

[22] Filed: Mar. 7, 1983

[30] Foreign Application Priority Data

Apr. 21, 1982 [DE] Fed. Rep. of Germany ....... 3214841
Feb. 25, 1983 [DE] Fed. Rep. of Germany ... 8305384[U]

[51] Int. Cl.³ ...................... H01R 13/629; H05K 1/00
[52] U.S. Cl. ............................ 339/75 M; 339/17 CF; 339/74 R
[58] Field of Search .............. 339/17 CF, 74 R, 75 R, 339/75 M, 75 MP; 174/52 FP

[56] References Cited

U.S. PATENT DOCUMENTS

| 2,825,037 | 2/1955 | French | 361/399 |
| 3,130,351 | 9/1961 | Giel | 339/17 |
| 3,750,085 | 7/1973 | Cooper | 339/75 M |
| 3,820,054 | 6/1974 | Clewes et al. | 339/17 CF |
| 3,883,207 | 5/1975 | Tomkiewcz | 339/75 M |
| 3,997,227 | 12/1976 | Cutchaw | 339/17 CF |
| 4,054,347 | 10/1977 | Mouissie | 339/75 M |
| 4,189,176 | 2/1980 | Grau | 339/75 MP |
| 4,193,656 | 3/1980 | Ward | 339/45 M |
| 4,266,839 | 5/1981 | Aiken | 339/75 MP |
| 4,266,840 | 5/1981 | Seidler | 339/75 M |
| 4,375,309 | 3/1983 | Griffin | 339/75 M |
| 4,402,563 | 9/1983 | Sinclair | 339/75 M |
| 4,407,555 | 10/1983 | Lockard | 339/75 M |

FOREIGN PATENT DOCUMENTS

2312119 12/1976 France .

Primary Examiner—John McQuade
Assistant Examiner—Steven C. Bishop
Attorney, Agent, or Firm—Poms, Smith, Lande and Rose

[57] ABSTRACT

A socket for dual-in-line components has two plates placed on top of the socket body between the rows of pin contact sockets. The plates are hinged together for a folding motion with the effect of a toggle lever for shutting the pin sockets on to the pins of the component and gripping them. The plates may be folded from an undone position down through a clamping position in which they are generally coplanar and then further into a position of stable equilibrium.

26 Claims, 13 Drawing Figures

PLUG CONNECTOR FOR DIL COMPONENTS

BACKGROUND OF THE INVENTION

The present invention is with respect to a plug connector for dual-in-line components made up of an insulating socket body having a number of socket contacts placed along the socket body in rows at the positions of the pins of a dual-in-line component package and each having a lower end part as a soldering pin sticking out from the lower face of the socket body, a middle part locked at least in part in the socket body and stretching through the same, and, as a further part of each socket contact, a top end part sticking out from the top side of the socket body and made in the form of a spring element for at least part of its length that may be changed in position along a spring path normal to the length direction of the socket contact, the spring elements being placed at such a distance from support faces placed along the top side of the socket body that the pins of dual-in-line components may be placed between the spring elements and the support faces.

The socket body furthermore has a clamping unit made up of at least two clamping plate parts with a hinge connection therebetween stretching along the length direction of the clamping unit, the outer edges of the clamping plates being placed within hollow lug elements so that the clamping plates are rested against the spring elements in the clamped and unclamped positions, and in the unclamped position the clamping plate parts are sloped upwards from the topside of the socket body like a roof and in the clamping position the clamping plates take the form of a plane that is parallel to the floor side of the socket body and the spring elements are able to be pressed against the long sides of the pins of the dual-in-line component and the last-named may be pressed against the support faces. A further part of the socket is in the form of a stop face formed on the top of the socket body against which at least part of clamping plate structure is rested in a position thereof which is different to the unclamped position.

DISCUSSION OF THE PRIOR ART

A socket connector on these general lines is to be seen for example in the U.S. Pat. No. 4,266,840 that has two clamping plate parts, which are joined together along a separate hinge connection placed on top of the clamping plate parts. This being so, on plugging a dual-in-line component into the socket body the hinge connection is acted upon by the lower face of the said dual-in-line component and as the last-named is pressed downwards the clamping plates are forced against support faces that are formed by edge parts of the socket body. The outcome of this is that the dual-in-line component is clamped more and more strongly even while it is being pushed into the socket and there is a danger of its not being able to be pushed right home as desired and furthermore if a great force is used in an attempt at pushing it home, the pins are likely to be bent and the inaccurate form of such bent pins will then be responsible for electrical trouble conditions, if the socket contact edges are evenly pressed against the pins. Troubles of the same sort are furthermore likely with the socket system of the U.S. Pat. No. 4,189,199, which is so designed that while the dual-in-line component is being pushed into the socket, it takes effect on plate elements and spring contacts joined therewith. Further examples of socket holders, in which the spring force comes into play even while the dual-in-line component is being pushed into place are to be seen in the U.S. Pat. Nos. 3,883,207 and 3,750,085, that have the same shortcomings natural with such a mechanical design. If however the main field of use of the socket bodies is for example in electrical circuits on circuit boards, in which permanent and trouble-free functioning of the dual-in-line component is desired, then the important points are firstly that the dual-in-line component almost automatically may be pushed smoothly into its regular end position as desired and that furthermore that there is no chance of the pins being bent. In this connection the socket systems noted here are of little use in giving the desired effect. It is for this reason that dual-in-line component sockets have been designed in which the component is first able to be put in position before there is any clamping of the pins. Designs on these lines are to be seen in the U.S. Pat. Nos. 3,997,227, 4,054,347 and 4,226,839, in the case of which there are rods in the middle for producing a pressing force, a pulling force or in the other case a twisting and pushing force acting on the spring contacts. However, in view of the complex structure of such sockets, their price is very high in relation to the price of the dual-in-line components, and in fact such sockets have made little headway in the fields of use of interest here.

A simpler design has been put forward in the U.S. Pat. No. 4,193,656 for example, in which the folding unit, because of the selection of the material of which it is made, may be used at the same time as a spring element for causing the desired pressing force on the pins of the dual-in-line component. Quite in addition to the fact that such a socket structure has the shortcoming that the spring force of the resin driving part comes into play even before the dual-in-line component has been pushed right home into the socket, there is a further shortcoming inasfar as the such an elastic resin material will not be able to give an even pressing force on all the pins at the same time.

Another design of socket with a folding mechanism, that is only worked when the dual-in-line component has been fully put in place is to be seen in the U.S. Pat. No. 3,829,054. While this design would seem simple at first sight, the form of socket does have the shortcoming that it may only be manufactured as a single socket that has to be placed at some distance from other sockets, because the side faces of the socket have to be spaced from each other to give room for the operation of the clamping unit.

The shortcoming of not being able to put the sockets in position sideways and lengthways in relation to each other as near to each other as is necessary in printed circuits whatever the way of fixing the dual-in-line components, that is to say by directly soldering into the p.c.b or with the use of a socket therebetween, is to be seen in the case of the socket design of the U.S. Pat. No. 4,266,840 as well, in which because of the form of structure as made necessary by the form of the spring contacts, the pins of a dual-in-line component and the soldering connection pins of the socket are in different positions and not in line with each other so that it is not necessary to take into account or to go into a further and space saving design of the socket side walls. A further point is that the socket design of the U.S. Pat. No. 4,266,840 has the shortcoming that a separate locking system using locking catches is needed to make certain that the clamping plates are not forced by vibrations out of the instable locking condition, in which they are acted on by springs, into the more stable undone condition with the outcome that the dual-in-line component would be unlocked and freed with a loss of contact with the socket contacts. Such a catch locking system is however only to be looked on as a further shortcoming inasfar as the socket design may then not be manufactured in a simple form at a low price.

SHORT OUTLINE OF THE INVENTION

For these reasons one purpose of the invention is that of designing a plug connector for dual-in-line components of the sort noted, such that with respect to its overall size and the positioning of its socket contacts it may be used in nearly all circuits designed to have the dual-in-line components fixed directly thereto, even if the components are placed very near to each other. A further purpose of the invention is to make possible such a plug connector that may be used when the components are placed very near each other. A still further purpose of the present invention is to make it possible for the dual-in-line component to be fixed safely in position after it has been put in the socket contacts without there being any need to give up the specially simple and low-price design.

For effecting these an further purposes of the invention that will become clear in the account of the invention herein the clamping plate parts are so designed that they may be moved past the clamping position into a locking position in which the clamping plate parts are sloped downwards towards the top side of the socket body and are rested at least in part on the stop face. Furthermore each spring element is in the form of a solid spring tonguepiece with a front face resting against the outer edge of the clamping plate and an back face turned towards the support face.

One more specially useful effect of the invention is that the new plug connector may be used for fitting to printed circuits that are complete and in use, that is to say the connector is fitted by way of a change after manufacture and not fitted in the first place. This is because a defective dual-in-line component may be desoldered and a connector in keeping with the invention fitted in place thereof without danger to the other components which might otherwise be caused by repeated soldering operations. After this has been done it is in fact possible for the dual-in-line components to be taken out of and fitted into the new connector simply by opening and shutting the contacts thereof. A condition for this being possible is however that the size of the new connector is generally in keeping with the size of the dual-in-line component itself and furthermore the socket contacts have soldering pins or wire wrap pins that are placed in the same positions as positions in the pin plane of the dual-in-line component or I.C. To take an example of this, the soldering connection pin of connector of the invention may be made with a square cross section because there is then no chance of "floating" of the socket in the solder bath of an automatic soldering system, this being because the liquid solder will have enough space between the side walls of the square soldering connection pins and the round hole in the p.c.b. to make its way through such spaces, this stopping any floating tendency.

A further important useful effect of the invention is that the new plug connector will keep the dual-in-line component firmly in place even when acted on by vibrations, because the clamping plates have a stable position, that is to say they are in stable equilibrium, in the clamping position and if vibrated would first have to be moved through clamping positions in which the spring forces thereon are higher, before they would come out of the instable clamping position and go into a stable undone position. Because the connector is designed with a locking position that is past and on the other side of the clamping position, the dual-in-line component is simply but strongly and safely kept in place in the socket.

To keep the design of the plug connector simple even in the unclamped position, there is on the one hand the design point that the hinge connection between the clamping plate parts has a stop means for limiting the angle of folding so that the spring forces acting on the outer edges of the clamping plate in the undone or unclamped position as well keep the clamping plate system in the fixed positions in the socket part. Because this is so in the new plug connector the outer edges of the clamping plate are kept in place directly by the spring contacts and by holding lug elements that are to be made separately, this offering useful effects from the design and price angle. A useful effect is produced if the holding lugs and the form of the outer clamping plate edges are arc segments or even in the form of a circular arc segment so that the clamping plate edges may be used as inner bearing parts and the spring elements as outer bearing parts or bearing shells. Cross grooves present in this bearing then make for an increase of the accurate guiding effect produced by the bearing on the one hand and of the friction forces on the other hand so that perfectly regular and defined motion of the system out of the unclamped position through the clamping position into the locking position and back again is possible. To this end it is best for a driving pin to be formed on at least one end face of the clamping plate parts. One such driving pin may be present at each end. In this respect such a pin may more specially and usefully be in the form of parts of the design of the hinge parts formed on the clamping plates and/or the hinge pins of the hinge or folding connection.

Because the locking position only has to be formed and made possible by one stop point for the clamping plate system on the top side of the socket body, it would be possible, as a general point, for a stop on these lines on the top side of the socket body for this purpose. However a useful effect is made possible if the top side of the socket body is made v-like with a large angle between the two sides of the letter v, because in this case there will be no transmission of vibrations in the form of point loads to the clamping plate system and in fact stop faces will be present on the clamping plates that make such undesired point loading effects impossible and this is of help in keeping the clamping plate parts safely in the locked position. The design of the clamping plate stop faces may be taken into account on producing the clamping plate body by molding without markedly increasing tooling costs.

It is quite as simple and useful for the design of the socket contacts to be such that they are generally or completely made in one piece and then pressed into the socket body. Because the top end parts of the socket contacts are in the form of spring tonguepieces, they are responsible for giving the desired spring force acting on the outer edges of the clamping plates. To make it possible for the spring tonguepieces to be put in place with the socket contacts in the socket body with the necessary force fit or clamping effect, a specially useful part of the design is such that stop or resting face of the spring tonguepieces is formed on the top side of the socket body, such top side being, if desired, in the form of notch or valley running into the body of the socket. All this is necessary in this respect is for the spring tonguepiece to be at a small angle to the stop face of the spring tonguepiece, such angle then generally limiting the degree of motion of the springs.

In a simpler form of the new plug connector of the invention the contact pins of the dual-in-line component are pressed against a support face by the spring tonguepiece, the support face being formed by an upwardly running edge of the socket body. This upwardly running edge may, as a further useful effect, by made with an inlet guiding slope, that makes it simpler for the dual-in-line component to be put in place.

In the case of a further form of the new plug connector the support face is formed on a support contact, that is itself formed at the top end part of the socket contact with same so that the top end part of the socket contact is made up on the one had of the spring tonguepiece and on the other and of the support contact. It is then possible for example to have a tuning fork-like design of the top end part of the socket contact, in the case of which a part of the socket contact has two cuts so as to make the spring tonguepiece. Because it is a question of getting high clamping forces, the support contact is then generally made with the socket contact from one single solid piece of material and a separate spring tonguepiece is joined up with the socket contact so that the spring tonguepiece goes from the lower end part of the socket contact, through the middle holding part and into the top end part of the socket contact. In such a form of the invention a useful effect is to be had if the support contact has a head part, that makes the support contact stronger in the top part and has a nose-like contact face this giving a loading effect which is more at a single point and less over a large area, this in turn making for a more intensive contact between the pin of the dual-in-line component and the socket contact. A further effect of the support contact is that there is a further moment of elasticity in addition to the moduli of elasticity in the clamping plate and generally in the spring tonguepiece. This is more specially important inasfar as all the parts of the new plug connector are to be profited from functionwise because of the small design size and dimensions.

A further useful effect may be produced in this connection if the support contact comes up against a support contact stop face after moving through along a small distance, the said stop face being, if desired, formed in the socket body edge and form this reason on the one hand stopping any overstretching of the support contacts on putting the dual-in-line component in place in the socket or on doing any other work on the contacts while on the other hand furthermore stopping the danger of one contact coming up against the contact next to it.

It is naturally possible for the new plug connector of the invention to be designed with test socket keepers so that the connector is more of the nature of a test socket plug connector, the same then only having to have driving pins for this purpose, that are taken up in the level system of a test socket. When this is done the new plug connector may be put to many further uses as a test socket, one then profiting from this inasfar as there is a uniform design of the plug connector.

Further useful developments and effects of the invention will be seen from the account to be given using the figures herein.

DETAILED ACCOUNT OF THE WORKING EXAMPLES OF THE INVENTION

Figure 1:
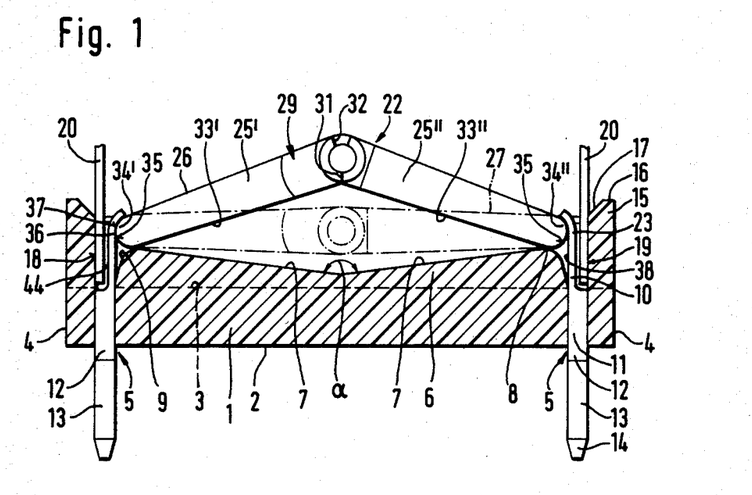
FIG. 1 is a section normal to the length direction of one form of plug connector in the case of which clamping plate parts are to be seen in an undone or unclamped position in full lines and in a clamping position in broken lines.

In FIG. 1 the reader will see that a socket body 1 has a lower side 2, a top side 3 and long sides 4. The top side 3 of the socket body 1 is covered over, in the part thereof between socket contacts 5 fitted in the body 1, by part 6 of a clamping plate stop face, and on the free top face of this part 6 the clamping plate stop face 7 is formed. This stop face 7 for the clamping plates is v-like as a sort of valley with its lowest point or line in the middle of the socket body. The obtuse angle $\alpha$ of the v-form is about 165 deg, although it is dependent on the use to which the connector is to be put, and the angle $\alpha$ may have other values and may be be between 180 and 150 deg while still giving the function needed in the present invention. Past the outer limiting lines 8 of the clamping plate stop face 7 the face takes on the form and function of a spring tonguepiece stop face 9, the same sloping at a relatively great angle to the top face of the socket 3 to the point where the socket contact 5, together with a top end part 10 will be seen sticking out from the top side of the socket body 3, whereas a middle keeper part 11 of the socket contact is fixed with a force fit in the socket body 1. From the lower side 2 of the socket body 1 a lower end part 12 of the socket contact 5 will be seen running downwards before changing into the soldering connection pin 13, that is square (i.e. of square cross section) and is pointed so that it may be more readily slipped into a hole, as for example a hole in a p.c.b.

Figure 7:
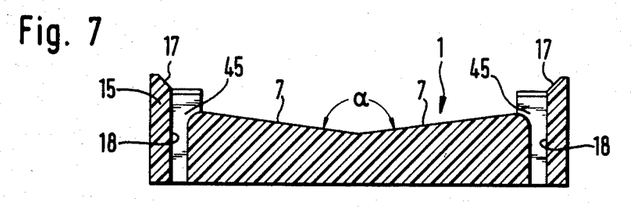
FIG. 7 is a section through a socket body before putting the socket contacts in place therein.

The long sides 4 of the socket body 1 are joined up with a socket edge 15, that on its top end side 16 has a sloping guide face 17 directed from the top end side 16 at a slope downwards towards the middle of the socket, it running as far as an inner socket edge side face 18, as will be seen more specially in FIG. 7.

It is to be noted at this point in the account of the invention that in all figures like parts are given like part numbers so that a separate account of each part in further examples of the invention is not necessary if an account has been given in an earlier example thereof.

Figure 2:
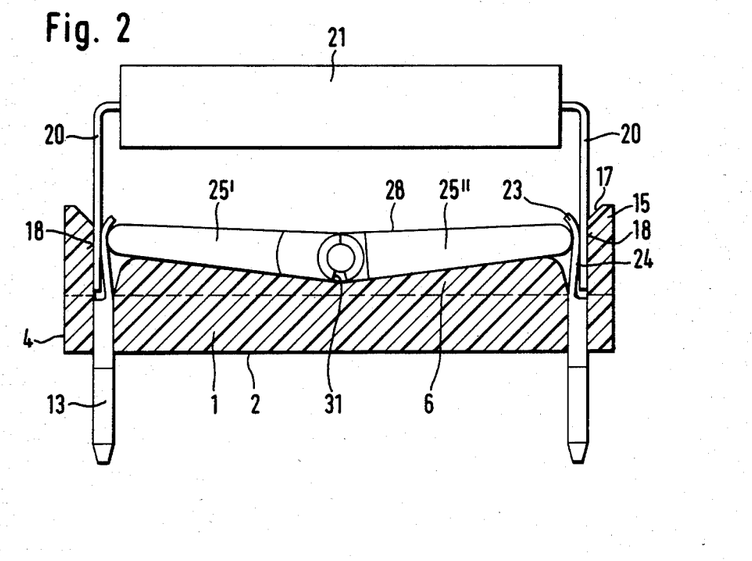
FIG. 2 is a view generally like that of FIG. 1, in the case of which however the clamping plate parts are marked in the locking position and the dual-in-line component is to be seen in full.

In the present working example of the invention the inner side edge 18 is used as a support face 19 for the pin 20 of a dual-in-line component 21, whose pins 20 have been fitted into the socket 1 and which, using a clamping system 22 as in FIG. 2, is clamped by way of the back face 24 of spring tonguepiece 23 against the inner side edge 18 of the socket edge 15.

In this respect in FIG. 1 the clamping system 22, that is made up of a left hand clamping plate part 25' and a right hand clamping plate part 25", will be seen in full lines in the undone position 27 and in the done up or clamping position it is marked in broken lines. In FIG. 2 the locking position 28 as a further position of operation, will be seen.

The clamping system 22 or mechanism has a folding or rocking connection 29 joining together the two clamping plate parts 25' and 25" using turnpin means 30. In the view of FIG. 2 the two clamping plate parts 25' and 25" will be seen to have a stop 31, formed next to the turnpin means 30, for limiting motion of the folding parts further upwards out of the undone position of FIG. 1. Furthermore there is a top stop 32 on the top of the clamping plate parts 25' and 25" for limiting downward folding motion past the locking position 28, because, it is then more readily possible for the clamping system to be assembled and produced to get it ready for operation. From the point of view of the function of the clamping system 22 itself the stop 32 for limiting folding motion is not necessary, seeing that the lower side 33' or 33' of the clamping plate parts 25' and 25" in any case is rested against the clamping plate stop face 7 in the locking position 28 so that the folding motion is limited thereby.

Figure 6:
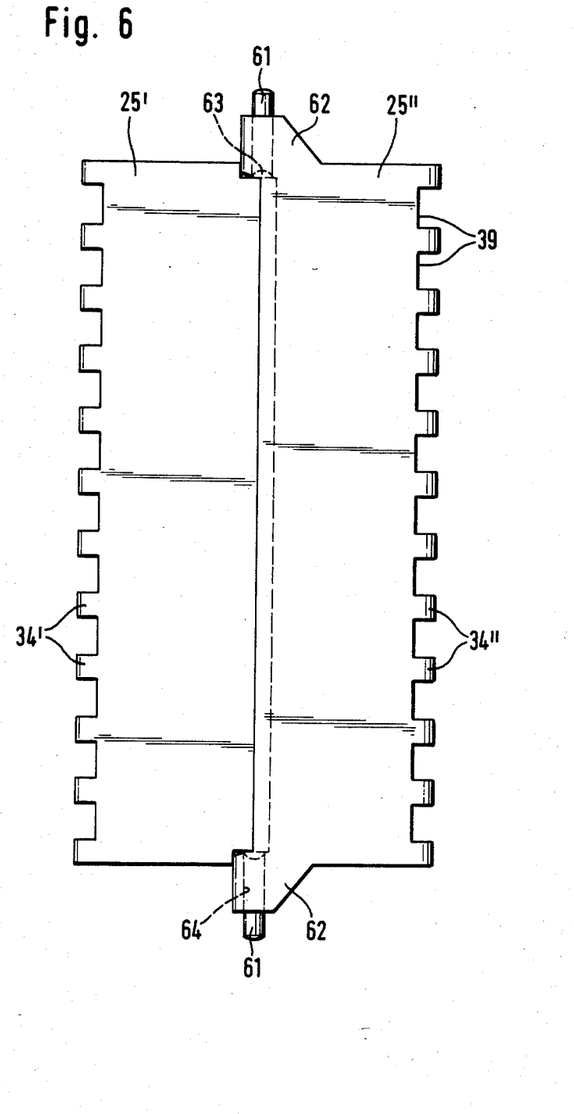
FIG. 6 is a plan view of the clamping plate system in keeping with FIGS. 1 and 2.

The outer edges 34' and 34" of the clamping plates are best made with a circular arc outline 35 or faces, such outlines being at least in part in keeping with the circular arc outline 37 of the keeper or holding lug elements 36 and resting against a front face 38 of the spring tonguepiece 23. Between the outer clamping plate edges 34' and 34" there are nosepieces 39—see FIG. 6—stretching as far as points between the socket contacts 5.

Figure 3:
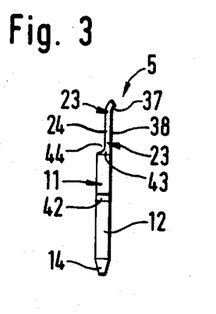
FIG. 3 is a view, looking in the length direction of the socket, of a first possible form of a socket contact, that is used in the working example of the invention in keeping with FIGS. 1 and 2.
Figure 4:
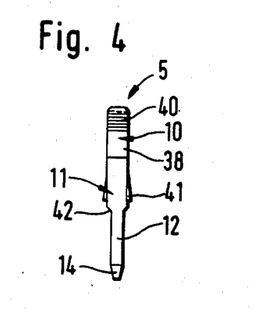
FIG. 4 is view of the socket contact of FIG. 3 looking in a direction turned through 90deg. from the direction in FIG. 3 in a horizontal plane.

In FIG. 3 the reader will see a single socket contact 5 as seen looking at the socket from the side thereof, while in FIG. 4 the same socket contact 5 will be seen looking in the length direction of the socket. It will be clearly seen that the contact 5 has cross grooves 40 for frictionally contacting the pins 20 of a dual-in-line component 21. It will furthermore be seen from FIG. 4 that there are locking hooks 41, with which the socket contact 5 may be locked or anchored in addition to the force fit effect in the socket body 1. Generally at the level of the locking hook 41 the socket 5 is joined with its end part 12 at a shoulder 42, the end part 12 being square. At the top limit of the middle keeper part 11, at which the spring tonguepiece 23 (FIG. 3) comes to an end 43 thereof, there is a contact space 44, that at the same time has the function of defining the space between the support face 19 and the back face 24 of the spring tonguepiece 23. The spring tonguepiece 23 is in the invention designed as a keeper lug element 36 with the arc outline 37, as will be seen in FIG. 3 as well.

Figure 5:
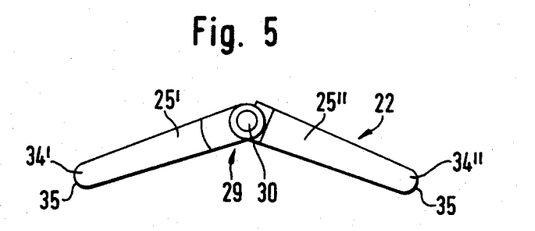
FIG. 5 is a view of the clamping plate system looking in the length direction of the socket.

In FIG. 5 the clamping system 22 will again be seen in the undone position 26, as the clamping system 22 is placed in the socket body 1 before assembly and then is in a position marked in full lines in FIG. 1.

It will be seen from FIG. 7 that the socket body 1 is so far without its socket contacts 5 and the clamping system 22. In this condition one may readily see the upwardly running or lipped socket edge 15 with inlet guide slope 17 next thereto. Furthermore the pockets 45 will be seen in which the socket contacts 5 are placed.

Figure 8:
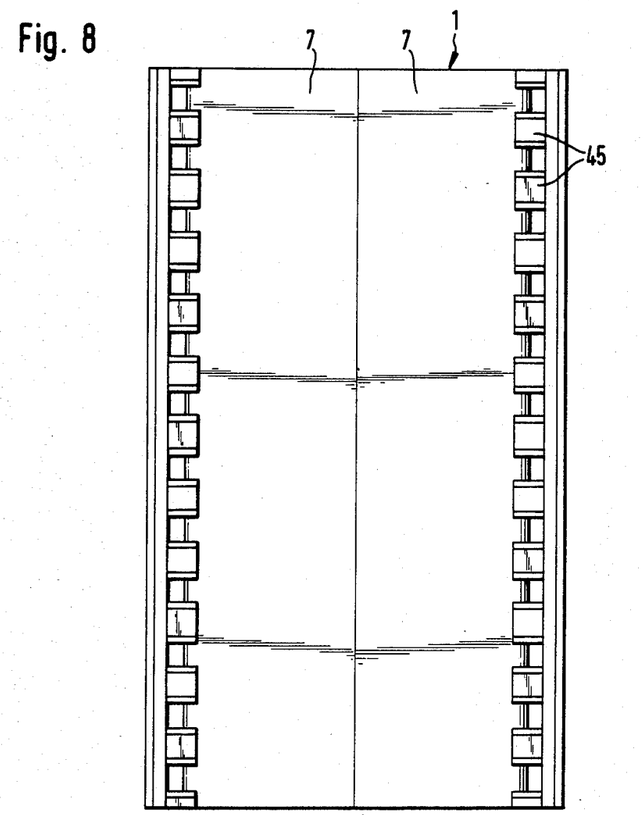
FIG. 8 is a plan view of the socket body in keeping with FIG. 7.

FIG. 8 is a plan view of the socket body 1 to be seen in FIG. 7, in the case of which the pockets 45 and the inlet guide slope 17 will be seen in plan. Furthermore the spaces between the separate pockets 45 wil be seen, which take up the nosepieces 39 of the clamping plates for stopping any slipping out of position of the clamping system 22 in the length direction of the socket.

Figure 9:
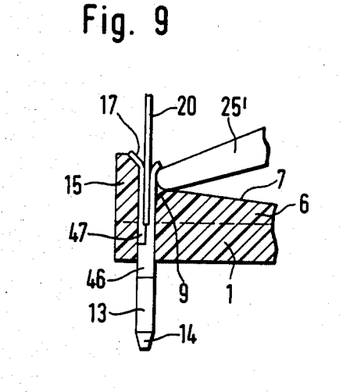
FIG. 9 is a section through a further working example of the invention in the form of a socket contact whose support face is formed together with the socket contact.

In the further working example of the socket contact 46 to be seen in FIG. 9, the inner side edge 18 is covered over by a support contact 47 so that the pin 20 of the dual-in-line component 21 is not clamped against the inner side edge 18 but against the support contact 47, the same then functioning as the support face 19. Because the support contact 47 takes up part of the contact space 44, the play for the pin 20 of the dual-in-line component 21 is greatly decreased when the pin is put into position. The support contact 47 is made stretching up as far as the inlet guide slope 17 so that there is less danger of the pins 20 being bent on putting the dual-in-line component in place and less danger of damage.

Figure 10:
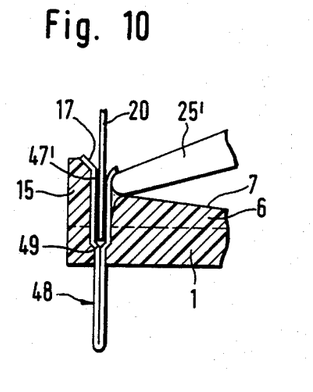
FIG. 10 is a view of a still further example of the socket contact like that of FIG. 9, and of the socket body that is like a tuning fork in form.

The further design of the socket contact 48 to be seen in FIG. 10 is such that there is again a support contact and socket contact 48 and the support contact 47 are like a tuning fork with outwardly flared ends, the lower inner end 49 of the tuning fork being positioned within the socket body 1 so that the overall height of the socket cum dil component is decreased. The socket contact 48 is cut into two halves in the length direction whereas the socket contact 46 of FIG. 9 is of the same design as the socket contact 5 and the only addition thereto is the support contact 47.

Figure 11:
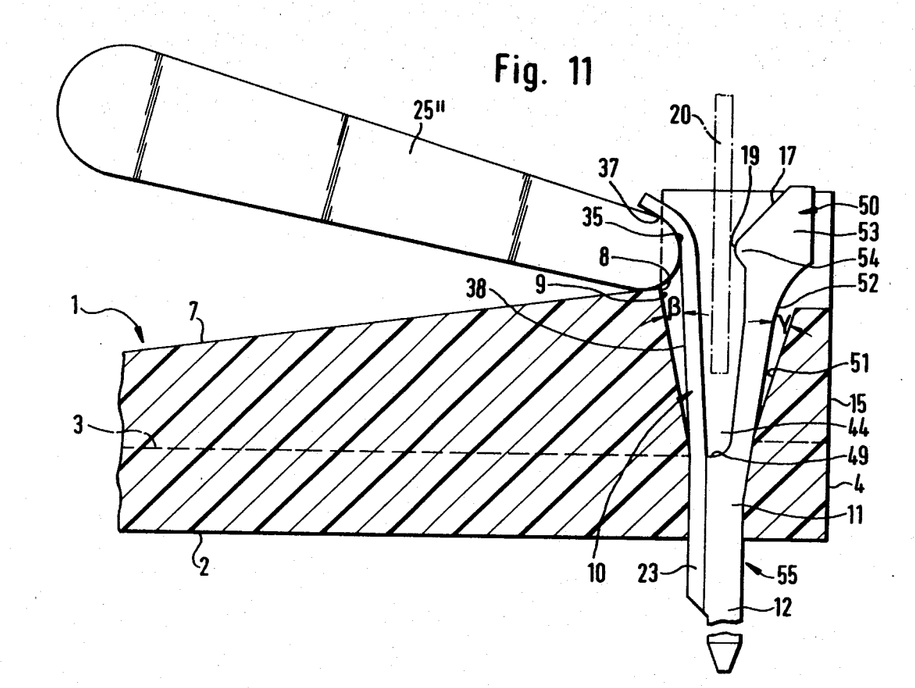
FIG. 11 is a view of a still further example of the socket contact.

In FIG. 11 the support contact 50 is in the form of the main contact and the spring tonguepiece 23 has a tail running down along the middle keeper part 11 and as far as the lower end part 12. In this design of FIG. 11 the spring tonguepiece 23 is riveted or welded to the solid support contact 50. It is naturally possible for the support contact 50 to be made in one piece with the spring tonguepiece 23. A further point is that in the design of FIG. 11 the clamping plate stop face 7 goes somewhat further into the contact space 44 than was the case with the design of FIG. 1, in which the clamping plate stop face 7 is changed into a rounded part past the outer limiting line 8, this being made clear in FIG. 7. In the example of the invention of FIG. 11 the spring tongue stop face 9, running from the top side 3 of the socket body 1, is taken as far as the clamping plate stop in the form of floating in the solder bath in automatic soldering systems, as has been noted at an earlier point in the present account. The shoulder or collar between the soldering connection, the pin and the middle part for this reason has the function of centering and supporting the plug connector in relation to the p.c.b., it shutting off the top end of the hole in the p.c.b. because of the inbetween slope. However such a design is then likely to be the cause of the complete socket floating in the solder if the design is not as in the present invention.

It will be seen from this that one point to be kept in mind in coming to an opinion on the present invention is that contacting of all the pins of a dual-in-line component is to be produced as far as possible at one and the same time by a mechanical clamping effect. Furthermore the pushing in and pulling out of the pins of the dual-in-line component is to take place regularly, without any great forces and friction at the points of contact and the contacting effect is to be as full and complete without vibrations and other outside effects decreasing the contact effect. The connector is to keep to these conditions even if the component is frequently taken out and put back again. The simple design is to make it possible to do without high-price materials and parts that are plated with noble metals and furthermore without complex processes of manufacture, this being made possible for example by the use of a single piece contact structure, that is so formed that a contacting effect is made possible even in the top part of the plug connector. The lower part of the socket is to be made completely solder tight and the soldering pins are to be so designed that there is no danger of floating on automatic soldering in a solder bath. It will be seen from this that unlike the prior art there is the useful effect in the invention that mechanical pressing effects are used to get a high contacting pressure which takes effect evenly on all the pins of a dual-in-line component and because the contacts are opened wide the dual-in-line component may be simply put in and taken out of the socket without any friction. The contacting effect is complete and full even when the socket is acted upon by vibrations and outside effects such as changes in temperature, industrial waste products in the atmosphere and the like. The clamping plates may be simply and quickly exchanged after the socket has been soldered in place if the this is necessary because of the plates having been damaged. The contacts do not have to be made of special materials such as beryllium copper or parts which are plated with noble metals. The contacts may be produced very simply and at a very low price without any risks on the technical side. The fact that the parts of the sockets are simple in form, is one of the reasons for regular and complete contacting even in the top part of the contact leg and the cross grooving in the contact part makes certain in addition of a complete contacting effect even if the connector is oxidized. Because the contact is in each case made in one single piece of metal, transmission losses may be cut down and because such parts are firmly rested against the clamping plates and the edge of the socket there is no danger of the pins of an I.C. being bent and not pushed into the holes therefor. Because the contacts are force-fitted in position they are completely sealed off against liquid solder and flux and because of the square end of the soldering connection there is no chance of floating when soldering in an automatic system with a solder bath, because there is enough space from the liquid solder at the side to get to the soldering posts by moving along the top side of the p.c.b. Because of the dimensions used the sockets may be put in rows and cross rows next to each other with little or no space between them with the desired spacing and because the clamping system takes up only a little space the sockets with their components do not take up any more space overall in the locked or clamped condition.

I claim:

1. A multi-pin connector for use with a dual-in-line component having pins placed in two lines that are parallel to each other, comprising:

(a) an insulating socket body having a middle portion
   (b) socket contacts in said body, said contacts
      (1) being placed at points lined-up with the pins of a dual-in-line component to be fitted in said socket,
      (2) each said contact having a soldering end part designed as a soldering pin and sticking out at a right angle from a side of said body that is to be placed on a printed circuit board,
      (3) each said contact having a middle keeper part fitted at least partly with a locking fit in the socket body, said middle part running through the socket body,
      (4) and each having a further end part opposite to said first noted end part, said further end sticking out from a side of the socket body opposite to the said board, said further end part being in the form of a spring element for at least part of its length that may be moved in a direction at a right angle to a lengthways axis of said body, said body further having support face means of which each is opposite to one of said further contact ends along sides of the said body, the spacing between the support face means and the further ends of the contacts being such that the pins of said dual-in-line component may be taken up therebetween.
   (c) two clamping plates forming a clamping system having lengthways edges at which they are foldingly joined together along a folding line, said plates having outer plate edges parallel to said fold line, said socket having keeper lug elements fitted partly round said outer plate edges, said plates being able to be folded between an unclamped position and a clamping position with said plate edges resting against the said spring elements in these two said positions, the clamping plates being folded and sloped away from said board in said unclamped position like a roof and in the clamping position being in a plane that is parallel to the side of said socket body next to said board, said spring elements being pressed towards said pins of said dual-in-line component in said clamping position to press said pins against said support faces with a clamping bias force
   (d) said body further having a stop face on the side thereof facing away from said board, said stopface having two sloped surfaces that are sloped like the sides of a valley inward towards the socket body middle portion and towards the side of said socket body next to said board
   (e) said clamping plates being able to be folded past the clamping position thereof into a locking position, in which the clamping plates are sloped like the sides of a valley towards said board and in which said clamping plates are at least partly rested against said sloped surfaces on said stop face and face 7 in an flat form. The spring tongue stop face 9 makes an acute angle $\beta$ with the front face 38 of the tonguepiece 23, the angle $\beta$ being in a range of 0 deg to about 30 deg and more specially having a value of 15 deg, as dependent on the position of the clamping system 22. The edge 15 of the socket furthermore has a support contact stop face 51, making an acute angle $\gamma$ with a back side 52 of the support contact 50. Dependent on the load on the support contact this acute angle $\gamma$ has a value between 30 deg and over 0 deg, the best value being 15 deg. The stop face 51 has as its main function that of stopping the support face 50 being bent out past the outer long side 4 of the socket body 1 and possibly then touching the next socket and making an undesired electrical connection. The support contact 50 has a head part 53, that has an inlet guide slope 17 generally the same as the socket edge 15 in the form of the invention to be seen in FIG. 1. The inlet guide slope 17 goes on further turning into a nosepiece 54, that on its front side has the support face 19 or a contact zone thereon, this causing a loading effect more at a point on the pin 20 of a dual-in-line component 21.

In the example of the invention of FIG. 11 the support contact 50 takes up the main pressing forces acting on the pin 20 with a certain degree of elasticity, whereas the spring tonguepiece 23 is in the first place responsible for making possible the main spring motion, it then transmitting the important pressing forces of the clamping system 22 from the clamping plate parts 25 through the solid material of the spring tonguepiece 23 from the front face 38 to the back face 24 and for this reason to the pin 20 of the dual-in-line component 21. It will be seen from this that the spring tonguepiece 23 has the function of a further or auxiliary contact and of a keeper lug, its main function naturally being the transmission of the spring forces for the clamping system. The contact space 44 is walled in by the back face 24 of the spring tonguepiece 23 and the front face of the support contact 50 at the side and the inner end 49 of the tuning fork structure at the lower end. If the socket body 1 is made in one piece, that is to say with the clamping plate stop face part 6 and the socket edge 15 in a single-piece structure, a notch or valley is formed by the spring tonguepiece stop face 9 on the one side and the support contact stop face 51 on the socket edge side, so that the spring tonguepiece 23 and the support contact 50 may be placed forming, when put together, the socket contact 55.

Figure 12:
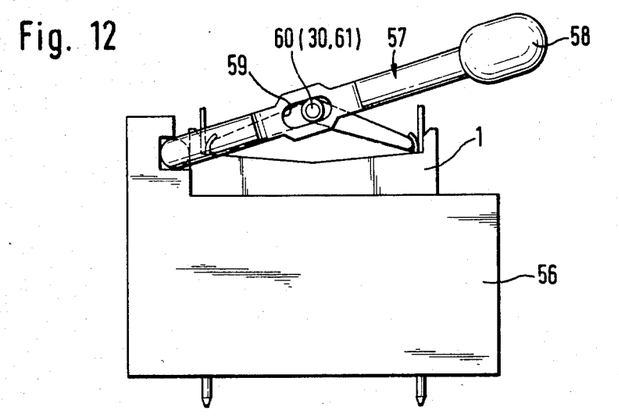
FIG. 12 is a view of a lever system as part of a testing socket.
Figure 13:
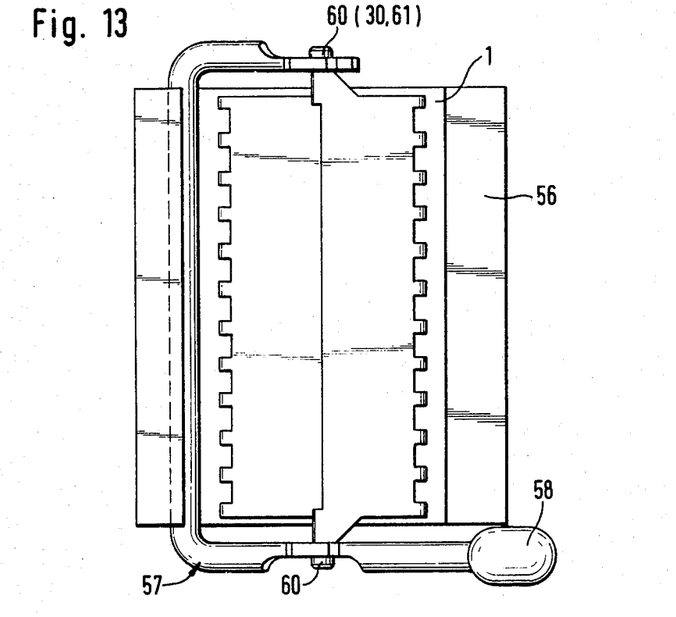
FIG. 13 is a view looking down onto the lever system of FIG. 12.

In FIG. 12 the reader will see a test socket 56, that has a lever system 57. A cutout 59 is formed in the driving lever 58, and in the cutout there is a driving pin 60. The driving pin 60 may be the turnpin 30, that may itself have a tail or may have a driving part 61 running into the cutout 59 so that using the driving lever 58 it is possible for the clamping system 22 to be folded out of the undone or unclamped position through the clamping position 27 and then into the locking position 28 and back again when desired. In FIG. 13 the reader will see a plan view of the system of FIG. 12, FIG. 13 being generally the same as FIG. 6 in which case as well there are the driving wings 62 with their own bolts 63. The bolts 63 may be formed on one clamping plate part 25' in a small outwardly curved part so that they may be snapped into holes 64 of the driving wings 62 with an elastic bending of the wings 62 when the parts are put together. In this respect the driving wings 62 are formed in the clamping plate part 25''. It is then possible for the turnpins 30 to be fitted into the holes 64 of the driving wings 62, tails of the turnpins sticking out into the lever system 57. It is however furthermore possible for the a pin of the lever system 57 to be taken up in the hole 64 of the driving button 62.

Plug connectors or sockets designed on the above lines are such that they may be mass produced simply using insulating material for the body with the pockets into which the socket contacts may be pressed. Because the large scale of integration makes for smaller dual-in-line components, the sockets therefor are of a small size and when they have to be placed in a checker-board formation, this is only possible with a socket in keeping with the present invention. Because the sockets have to keep to very tight electrical and mechanical specifications, miniature contacts with pre-stressed contact springs have to be able to be put and housed in the limited amount of space on hand. To keep to such specifications electrically and for stopping the semiconductor components from falling out or working loose because of vibrations or other undesired outside effects acting on them, relatively strong spring forces are needed acting within small spaces without on the other hand damaging the contact points because the spring contact legs are overhighly stressed, as is the case in prior art sockets, because the high forces then needed for pushing in and pulling out the pins.

If the vibrations acting on the sockets are in a certain frequency range there is then a chance of parasitic vibration so that there will then be a loss of the holding forces produced by the spring contacts and there is a danger of a semiconductor component dropping out of its socket or at least there is like to be a change in the contact effect or contact resistance. This is something which is not to be put up with in certain fields of use, as for example in airplanes and spacecraft and furthermore in electro-plating plants, to name but some of the important fields in question. Furthermore the durability of soft contact springs for dual-in-line components may not be as desired because of outside effects such as heat, cold, aggressive atmospheres, humidity and the like.

Because the socket is to be designed for use with high spring forces acting within a very limited space, it has so far in the prior art in many cases been necessary to make use of high-quality specially contact materials, such as noble metals, parts electroplated therewith and for this reason, complex and high-price processes of manufacture, something that is taken care of in the present invention as well, that is to say made unnecessary. For example in the case of high-quality dual-in-line plug connectors the contact assemblies are made up of a number of contact parts using a twisted or wrapped outer sleeve with a gold-plated spring pressed thereinto, this however again being likely to be the cause of further voltage drops and the danger of corrosion, more specially in the case of high frequency applications. A further shortcoming that is taken care of by the present invention is that with low-price sockets there is a chance of the pins of the dual-in-line component not being pushed into the separate sockets therefor and landing to the side thereof in a bent or hooked condition. A still further shortcoming of such low-price sockets is that they have hollows opening onto the p.c.b. so that when being soldered in place there is a chance of the liquid solder and fumes from the soldering process making their way into the contact zone and making a safe and complete contacting effect impossible. In this connection it is to be noted that even in the case of high-quality plug connectors there is likely to be trouble (f) each spring element is in the form of solid spring tonguepiece with a front face resting against one of said edges of said clamping plates and with a back face turned towards the support face, said tonguepiece and edges being shaped so that the bias force exerted by said edge against said tonguepiece in said locking position is less than said clamping bias force, but sufficient to clamp said pins within said socket body to thereby prevent said clamping plates from inadvertently moving back through said clamping position to said unclamped position once said clamping plates have been moved to said locking position.

2. The connector as claimed in claim 1 further comprising a hinge connection between two said clamping plates, said hinge connection limiting motion of said clamping plates and said hinge connection being made up of hinge bearings and a turnpin running in same.

3. The connector as claimed in claim 1 wherein said keeper lug elements are formed by said spring tonguepieces.

4. The connector as claimed in claim 3 wherein said keeper lug of the keeper lug element has an arc-like part formed at a free end of the spring tonguepiece.

5. The connector as claimed in claim 4 wherein said arc-like part is part circular.

6. The connector as claimed in claim 4 wherein the outer edges of said clamping plates parallel to said hinge line have an arc-like face mating with said arc-like part.

7. The connector as claimed in claim 4 having cross grooving on the back side of the spring tonguepiece, said grooving running in the length direction of said connector.

8. The connector as claimed in claim 1 comprising driving wings on end faces of the said clamping plates for the purpose of moving said clamping plates between the unclamped position and the clamping positions and back again.

9. The connector as claimed in claim 1 wherein the stop face part formed on the side of the socket body turned away from the board and used for stopping motion of the clamping plates has an outline that at least in part is the same as the outline of the side of the clamping plates on their side facing the board when the said plates are in their locked position.

10. The connector as claimed in claim 9 wherein said outline is v-like with two legs thereof making an angle between them in the range of 180 to 150 deg.

11. The connector as claimed in claim 10 wherein said angle is equal to 165 deg.

12. The connector as claimed in claim 9 wherein said stop face part has a stop face part for said spring tonguepieces, against which said spring tonguepieces may be pressed while being at least partly spring loaded.

13. The connector as claimed in claim 11 wherein the spring tonguepiece stop face is designed running from the middle keeper part of each contact as far as the clamping plate stop face of the clamping plate.

14. The connector as claimed in claim 13 wherein the front face of each spring tonguepiece makes an angle in a range of between 0 deg and 45 deg with the stop face of the spring tonguepiece at least in the clamping and locking positions of the clamping plates.

15. The connector as claimed in claim 14 wherein said angle is equal to about 15 deg.

16. The connector as claimed in claim 1 wherein the support face on the side of the socket body turned away from said board is formed by a support contact in the end part, turned away from said board, of the socket contact.

17. The connector as claimed in claim 2 wherein the spring tonguepieces are designed running from the first-noted end part of the socket contacts.

18. The connector as claimed in claim 17 wherein the support face on the side of the socket body turned away from said board is formed by a support contact in the end part, turned away from said board, of the socket contact, and wherein said support contact has a solid head part on which said support face is formed.

19. The connector as claimed in claim 18 wherein the support face is in the form of a flattened nosepiece on the head part.

20. The connector as claimed in claim 18 wherein said socket body has a v-like notch, the sides of said notch forming the spring tonguepiece stop face on the side facing the middle of the socket and a support contact stop face on the side facing the long side of the socket body.

21. The connector as claimed in claim 19 wherein the support contact stop face makes an angle of between 0 deg and 30 deg with the back side of the support contact.

22. The connector as claimed in claim 21 wherein said angle is about 10 deg.

23. The connector as claimed in claim 22 wherein the support contact is so designed that on being rocked in abuttment with the support contact stop face it does not project from the long side of the socket body.

24. The connector as claimed in claim 23 including driving wings on the end faces of said clamping plates for the purpose of moving said clamping plates between the unclamped position and the clamping positions and back again, wherein the driving wings have a length stretching as far as a lever system forming part of a test socket.

25. The connector as claimed in claim 24 wherein the driving wings are formed by the hinge connection.

26. The connector as claimed in claim 4 having cross grooving on the front face of said tonguepiece, said grooving running in the length direction of said connector.

* * * * *